(12) United States Patent
Scheek et al.

(10) Patent No.: US 12,075,227 B2
(45) Date of Patent: Aug. 27, 2024

(54) MEMBRANE UNIT FOR SPEAKER DEVICE

(71) Applicant: Mayht Holding B.V., Nieuw-Vennep (NL)

(72) Inventors: Timothy Ruben Scheek, Rotterdam (NL); Onno Hein Steenhuis, Rotterdam (NL)

(73) Assignee: Mayht Holding B.V., Nieuw-Vennep (NL)

( * ) Notice: Subject to any disclaimer, the term of this patent is extended or adjusted under 35 U.S.C. 154(b) by 243 days.

(21) Appl. No.: 17/434,013

(22) PCT Filed: Jul. 9, 2019

(86) PCT No.: PCT/EP2019/068433
§ 371 (c)(1),
(2) Date: Aug. 26, 2021

(87) PCT Pub. No.: WO2020/182321
PCT Pub. Date: Sep. 17, 2020

(65) Prior Publication Data
US 2022/0141590 A1    May 5, 2022

(30) Foreign Application Priority Data
Mar. 13, 2019   (EP) .................... 19162460

(51) Int. Cl.
*H04R 7/06*     (2006.01)
*H01F 27/32*    (2006.01)
*H04R 9/04*     (2006.01)
*H04R 9/06*     (2006.01)
*H04R 31/00*    (2006.01)
(Continued)

(52) U.S. Cl.
CPC ............. *H04R 7/06* (2013.01); *H01F 27/325* (2013.01); *H04R 9/046* (2013.01); *H04R 9/06* (2013.01); *H04R 31/003* (2013.01); *H05K 1/0213* (2013.01); *H05K 1/181* (2013.01);
(Continued)

(58) Field of Classification Search
None
See application file for complete search history.

(56) References Cited

U.S. PATENT DOCUMENTS 6,404,896 B1 *  6/2002  Yoo ........................ H04R 9/045
                                              381/431
6,654,476 B1 * 11/2003  Guenther ................. H04R 9/04
                                              381/409
(Continued)

FOREIGN PATENT DOCUMENTS

EP          1073312 A2    1/2001
KR       20120053815 A    5/2012
(Continued)

*Primary Examiner* — James K Mooney
(74) *Attorney, Agent, or Firm* — Fortem IP LLP

(57) ABSTRACT

Membrane unit for a speaker device, the membrane unit comprising a membrane and at least two coils. The respective longitudinal axes of the at least two coils are arranged in parallel along a main axis, a main surface being formed perpendicular to the main axis. The at least two coils are positioned adjacent to each other and mechanically connected to the membrane, the membrane being substantially flat and having a major surface parallel to the main surface. Wiring to the at least two coils is provided at least partly on a flat part of the membrane.

15 Claims, 6 Drawing Sheets

(51) Int. Cl.
  *H05K 1/02* (2006.01)
  *H05K 1/18* (2006.01)
  *H05K 3/00* (2006.01)
  *H04R 9/02* (2006.01)

(52) U.S. Cl.
  CPC ............ *H05K 3/0011* (2013.01); *H04R 9/025* (2013.01); *H05K 2201/1003* (2013.01)

(56) References Cited

U.S. PATENT DOCUMENTS

2012/0045079 A1* 2/2012 Kukurudza .............. H04R 3/00
  381/94.1
2015/0373830 A1* 12/2015 Miyagawa ........... H05K 1/0281
  174/254

FOREIGN PATENT DOCUMENTS

| KR | 101222416 B1 * | 1/2013 |
| KR | 101305164 B1 * | 9/2013 |
| KR | 101808585 B1 * | 12/2017 |

\* cited by examiner

MEMBRANE UNIT FOR SPEAKER DEVICE

CROSS-REFERENCE TO RELATED APPLICATION

The present application is a 371 National Phase application of International Application No. PCT/EP2019/068433, filed Jul. 9, 2019, which claims priority to European Patent Application No. 19162460, filed Mar. 13, 2019, each of which is incorporated by reference herein in its entirety.

FIELD OF THE INVENTION

The present invention relates to a membrane unit for a speaker device, the membrane unit comprising a membrane and at least two coils.

BACKGROUND ART

U.S. Pat. No. 6,570,994 discloses an apparatus for integrating a speaker with button or keyboard components such as a tactile membrane and/or a PCB. The tactile membrane conventionally used between buttons and switch mechanisms to provide tactile feedback to a user upon depression of the button is extended to form a vibrating portion of a speaker. The vibrating portion is doped with or otherwise includes an activating material, such as copper, is physically affected by a magnetic field. The activating material may be adhered to the upper and/or lower side of the vibrating portion, or doped therein. A coil for the speaker is formed with a coil tracing pattern formed on one or more layers of a PCB. One or more amplifier circuits may be included to drive one or more coil patterns, to cause a fluctuating magnetic field in the direction perpendicular to the vibrating portion of the tactile membrane. The vibrating portion of the tactile membrane responds to the fluctuations in the magnetic field, causing audible sounds to be output.

US patent publication US2013/0089232 discloses a voice film of a multi-layered structure for a flat panel speaker which can be used in a high-capacity speaker by increasing the number of turns of a coil or the magnetic flux density of the coil using a stack type PCB in order to increase the intensity of induced electromotive force.

SUMMARY OF THE INVENTION

The present invention seeks to provide a membrane unit for a speaker device which is cost efficient and easy to manufacture and assemble, yet allows to provide a good quality speaker device.

According to the present invention, a membrane unit of the type referred to in the preamble is provided, wherein the membrane unit comprises a membrane and at least two (voice) coils, wherein respective longitudinal axes of the at least two coils are arranged in parallel. A main surface is formed perpendicular to the respective longitudinal axes and the at least two coils are positioned adjacent to each other and mechanically connected to the membrane. The membrane is substantially flat and has a major surface parallel to the main surface, wherein wiring (or traces, or equivalent conductive connections) to the at least two coils is provided at least partly on a flat part of the membrane.

The membrane unit of the present invention greatly simplifies the interaction of a plurality of (voice) coils with a driver system for driving each of the coils, such as a magnetic assembly. The membrane 2 may act as a wiring support element or printed circuit board (PCB) having embedded therein or arranged thereon the wiring, wherein the wiring support element or printed circuit board, in turn, act as a diaphragm for converting mechanical vibration to sound or vice versa.

In an embodiment, the flat part of the membrane is a wiring support element, which allows for efficient routing of the wiring to the at least two coils. The wiring may be embedded in or arranged on the wiring support element. The wiring support element provides for distributed, even support of the wiring such that any wear or tear due to vibration is minimized.

In an embodiment, the wiring support element is a printed circuit board, wherein the printed circuit board being part of the membrane. Here, the printed circuit board provides effective and secure routing of the wiring to the at least two coils.

In an embodiment, the wiring support element is a printed circuit board, wherein the printed circuit board is attached to the membrane. In this embodiment, the printed circuit board is provided as a separate component and attached, e.g. glued, to the membrane, allowing simplified manufacturing process and allowing the membrane to take any shape for optimal sound production.

In an alternative embodiment, the wiring support element is a printed circuit board, the printed circuit board forming the membrane. That is, in this embodiment the printed circuit board is integrally formed with the membrane as a single piece component as a result of which the printed circuit board fulfills at least two functions, being 1) reliably and evenly supporting/routing the wiring to the at least two coils, and 2) acting as a diaphragm for converting mechanical vibrations of the printed circuit board to sound or vice versa. This particular dual purpose of the wiring support element, i.e. the printed circuit board, provides for a greatly simplified and robust design of the membrane unit for use in a speaker device.

SHORT DESCRIPTION OF DRAWINGS

The present invention will be discussed in more detail below, with reference to the attached drawings, in which FIG. 1A-C show a top view, side view and perspective view, respectively of a membrane unit according to a first embodiment of the present invention;

FIG. 2A-C show a top view, side view and perspective view, respectively of a membrane unit according to a second embodiment of the present invention;

FIG. 3A-C show a top view, side view and perspective view, respectively of a membrane unit according to a third embodiment of the present invention;

FIG. 4A-C show a top view, side view and perspective view, respectively of a membrane unit according to a fourth embodiment of the present invention;

DESCRIPTION OF EMBODIMENTS

Figure 1A:
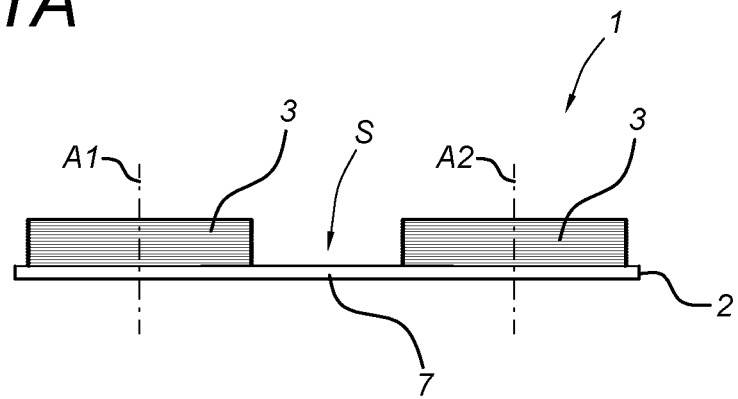

Exemplary embodiments of a membrane unit 1 of the present invention are depicted in FIGS. 1 to 6 showing common components that are identified through common reference numerals. In particular, as shown in the FIGS. 1A-1C, these common components include a membrane unit 1 for a speaker device, wherein the membrane unit 1 comprises a membrane 2 and at least two coils 3, wherein longitudinal axes A1, A2 of the at least two coils 3 are arranged in parallel. A main surface is formed perpendicular to the respective longitudinal axes A1, A2, wherein the at least two coils 3 are positioned adjacent to each other, spaced apart, and mechanically connected to the membrane 2. The membrane 2 is flat, e.g. substantially flat, and has a major surface S which is parallel to the aforementioned main surface. Therefore the major surface S is substantially perpendicular to the longitudinal axes A1, A2. Wiring (or wires, traces or other equivalent conductive connections) 4, 5, 6 to the at least two coils 3 are provided at least in part on a (substantially) flat part of the membrane 2.

It is understood that the membrane 2 may be seen as a diaphragm, which acts as a transducer for converting mechanical vibrations of the membrane/diaphragm 2 by the at least two coils 3 to sound or vice versa.

In an embodiment, the flat part of the membrane 2 is a wiring support element 7, which provides for secure and reliable attachment of the wiring/traces 4, 5, 6 to the membrane unit 2. In a further embodiment, the wiring support element 7 is a Printed Circuit Board (PCB), wherein the PCB is part of the membrane 2. In this embodiment, the PCB provides robust routing of the wiring to the at least two coils.

In an alternative embodiment, the wiring support element 7 is a PCB, but wherein the PCB is attached to the membrane 2, e.g. as a separate component. For example, the PCB may be seen as a separate component securely attached, e.g. glued, to the membrane 2. In this embodiment the membrane 2 may have any desirable shape to provide optimal sound production and where the PCB is attached to the substantially flat part of the membrane 2.

In an advantageous embodiment, the wiring support element 7 is a PCB and the PCB forms the membrane 2. In this embodiment the PCB itself acts as a diaphragm for producing sound. In particular, the wiring support element 7 and the PCB are integrally formed as a single piece component, thereby minimizing component count and reducing the complexity of the membrane unit 1 as the wiring support element 7, i.e. the PCB, now acts as the diaphragm as mentioned earlier. Therefore, in this embodiment the PCB is the membrane 2 as a result of which the PCB fulfils two functions, being 1) reliably and evenly supporting/routing the wiring 4, 5, 6 to the at least two coils, and 2) acting as a diaphragm for converting mechanical vibrations of the PCB to sound or vice versa. This dual purpose of the wiring support element 7, i.e. the PCB, provides for a greatly simplified and robust design of the membrane unit 1 for use in a speaker device.

In an embodiment, the wiring 4, 5, 6 to the at least two coils 3 is embedded in the membrane 2 for e.g. protecting the wiring 4, 5, 6 and/or to minimize a thickness of the membrane 2. Also, embedding the wiring 4, 5, 6 in the membrane 2 minimizes damage thereof due to vibrations.

In a further embodiment the wiring 4, 5, 6 to the at least two coils 3 may be arranged on the membrane 2 for e.g. simplifying the design and/or manufacturing process of the membrane unit 1.

As mentioned earlier, the membrane 2 may comprise a flat part as a wiring support element 7, wherein the wiring 4, 5, 6 is embedded in the wiring support element 7 or are arranged thereon. Advantageously, the wiring support element 7 is a PCB, wherein the PCB may be part of the membrane 2 as a single piece component, or the PCB may be arranged on the membrane 2 as a separate component.

Based on these embodiments, it is clear that the wiring 4, 5, 6, to the at least two coils 3 may be embedded in the major surface S or arranged on the major surface S of the membrane 2, wherein the membrane 2 itself may be a PCB. In case a separate PCB is provided arranged on the major surface S of the membrane 2, then the wiring 4, 5, 6, to the at least two coils 3 may be embedded in or arranged on the PCB, the at least two coils 3 are arranged on the PCB.

In an embodiment, each of the at least two (or the plurality of) voice coils 3 is wired in series in/on the membrane 2, or in/on the wiring support element 7, e.g. a PCB 7. As depicted, the wiring 4, 5 may be seen as positive and negative terminals of the membrane unit 1.

Figure 1B:
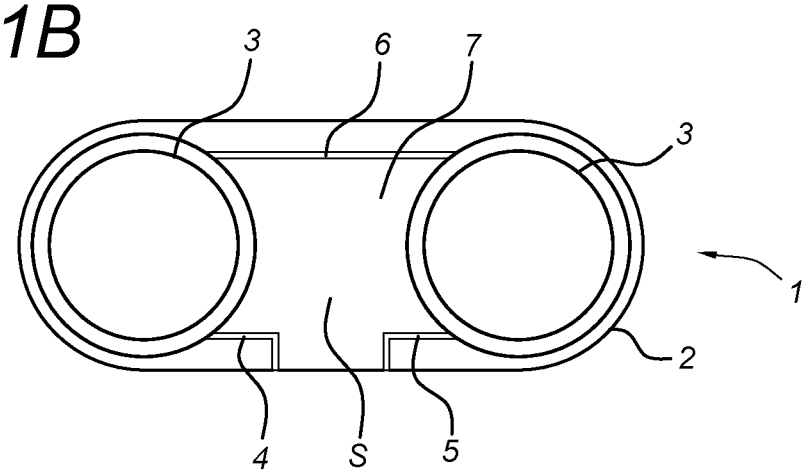
Figure 1C:
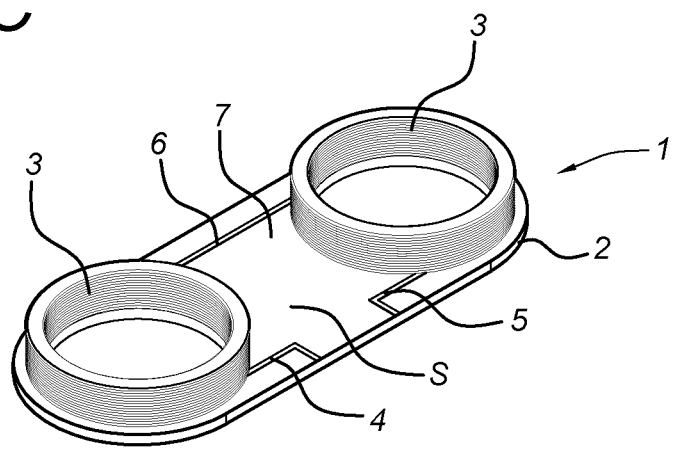
Figure 2A:
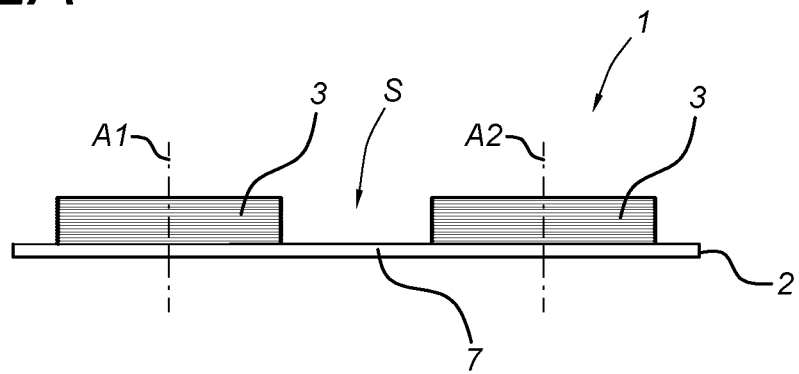
Figure 2B:
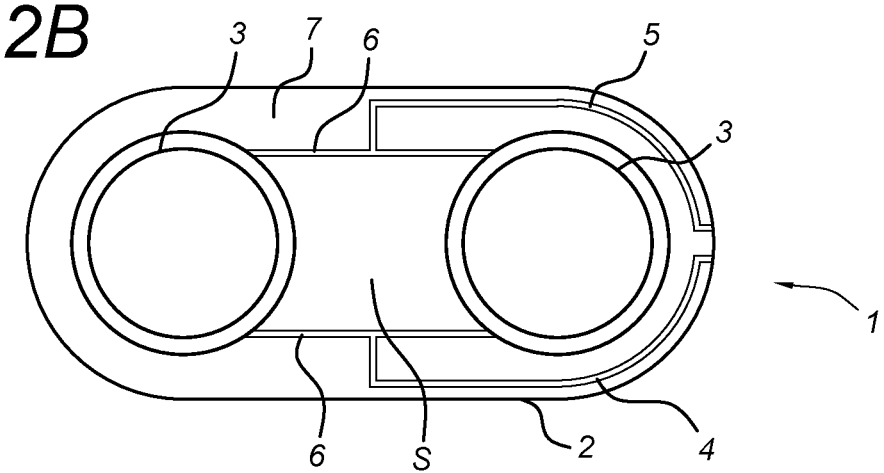
Figure 2C:
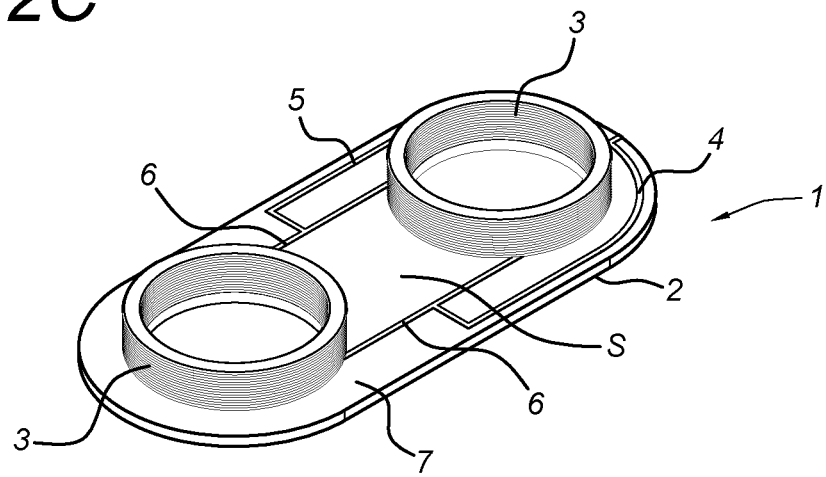
Figure 3A:
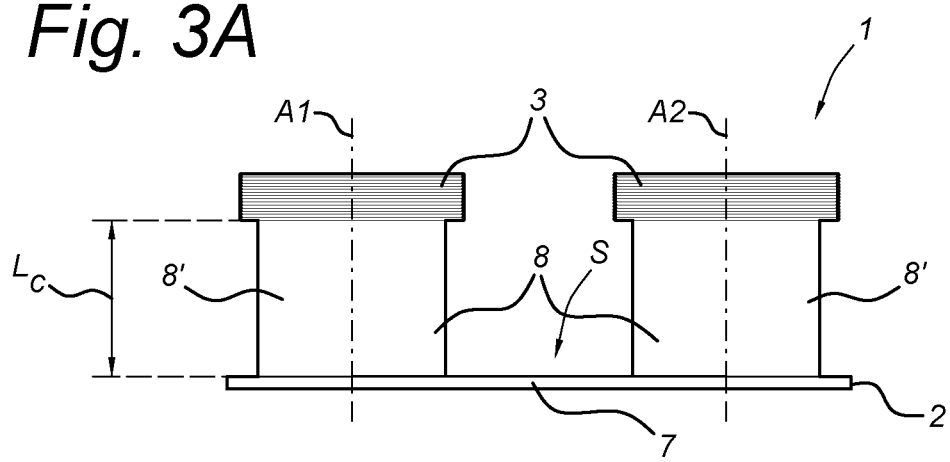
Figure 3B:
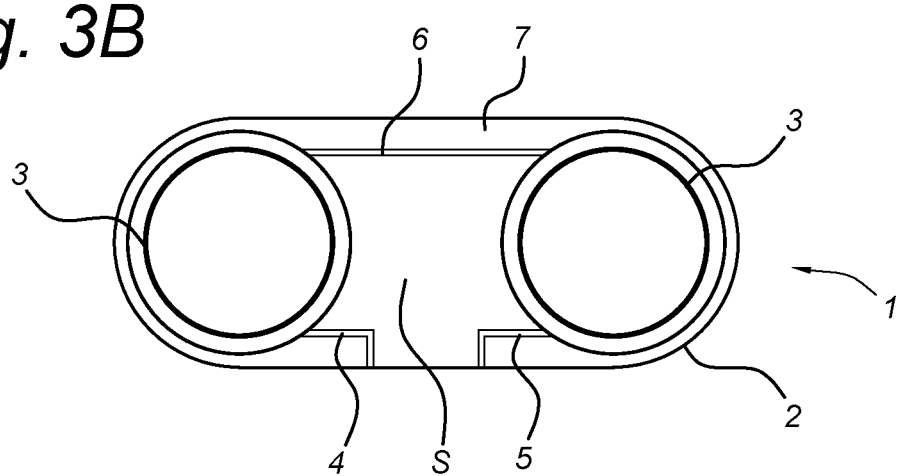
Figure 3C:
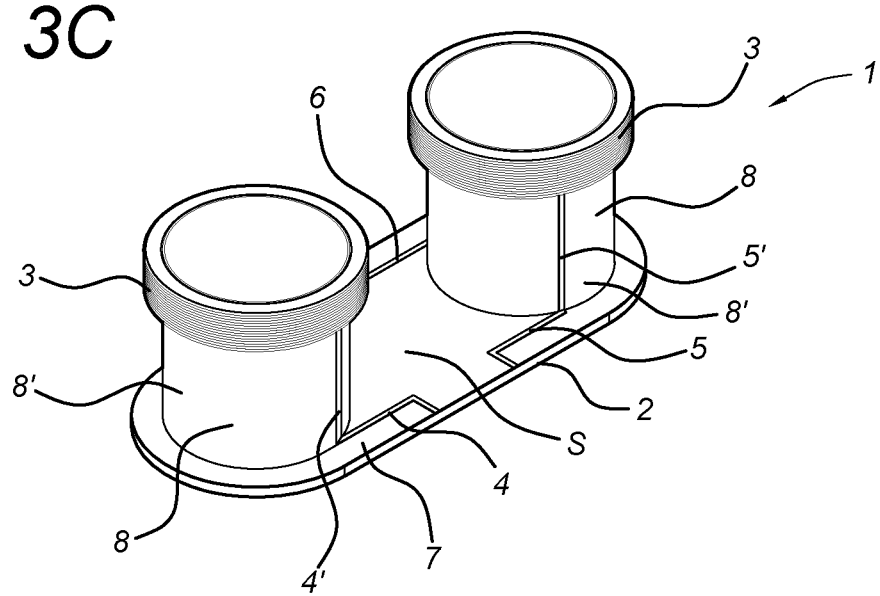
Figure 4A:
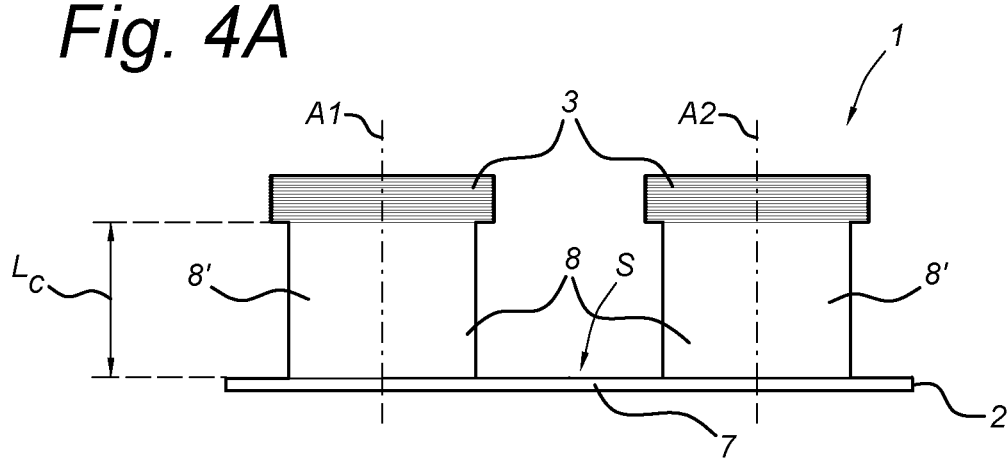
Figure 4B:
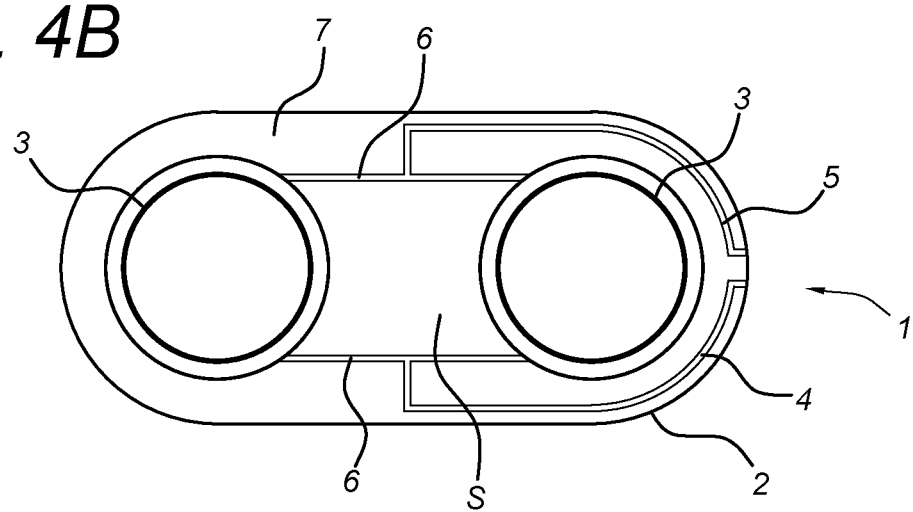
Figure 4C:
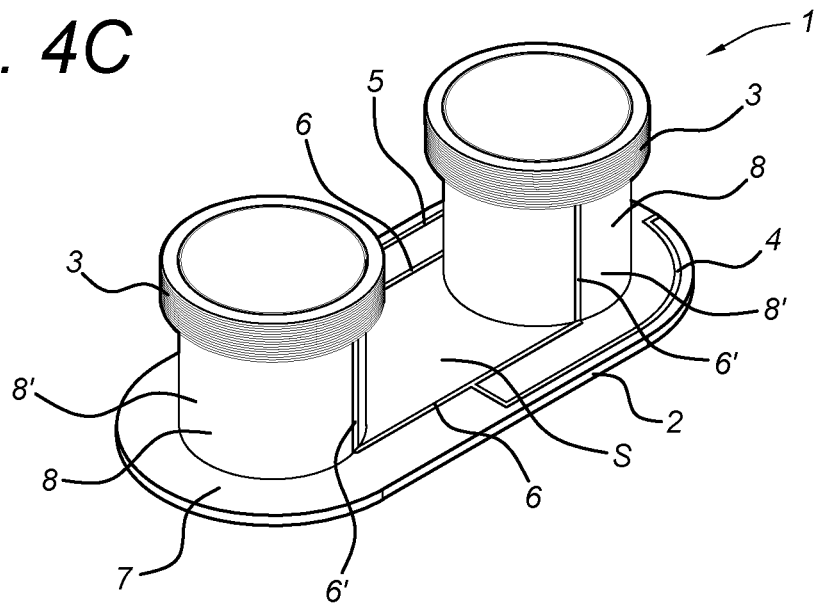

In FIGS. 2A-2C similar embodiments to the embodiments of FIG. 1A-1C are shown except that in the depicted embodiments of FIGS. 2A-2C the at least two voice coils 3 are wired in parallel in/on the membrane 2, or in/on the wiring support element 7, e.g. a PCB 7.

In the embodiments of FIGS. 1A-1C and 2A-2C, each of the at least two coils 3 are arranged on the major surface S of the membrane 2, e.g. wherein the at least two coils 3 are in contact engagement with the major surface S and extend away therefrom along the longitudinal axes A1, A2. By arranging the at least two coils 3 on the major surface S it is possible to minimize a thickness/height of the membrane unit 1, allowing the membrane unit 1 to be incorporated in a speaker device subject to size constraints.

In FIGS. 3A-3C and 4A-4C, further embodiments of the membrane unit 1 are depicted wherein the membrane 2 comprises at least two bobbin members 8 arranged on the major surface S and wherein the at least two bobbin members 8 extend along the longitudinal axes A1, A2 of the at least two coils 3. Each of the at least two coils 3 is arranged, e.g. wound, around one of the at least two bobbin members 8. That is, in an embodiment the at least two coils 3 are attached to a respective bobbin member 8, and the respective bobbin member 8 is attached to the membrane 2, e.g. attached to the major surface S of the membrane 2.

In an embodiment, a part/portion 4', 5', 6' of the wiring 4, 5, 6 to the at least two coils 3 is provided on a surface (inner or outer surface) of the respective bobbin members 8.

As shown, the bobbin members 8 allow for the at least two coils 3 to be arranged away/offset from the major surface S of the membrane 2 at a coil offset distance Lc, which is larger than zero. Each part/portions 4', 5', 6' of the wiring 4, 5, 6 then span the coil length Lc between the at least two coils 3 and the membrane 2.

Note that FIGS. 1A-1C and 3A-3C show embodiments wherein the at least two coils 3 are connected in series. In an embodiment the wiring 4, 5, 6 to the at least two coils 3 may then comprise a series connection wiring/trace 6 provided on the membrane 2, i.e. the wiring support element 7, e.g. a PCB. Further, it is noted that the embodiments shown in FIGS. 2A-2B and FIG. 4A-4C show embodiments wherein the at least two coils are connected in parallel. The wiring 6 to the at least two coils 3 comprise a parallel connection wiring 6 provided on the membrane 2. In an embodiment, the parallel connection wiring 6 may be embedded in or arranged on the membrane 2. In a further embodiment, the parallel connection wiring/trace 6 may be embedded in or arranged in/on the wiring support element 7, e.g. in/on a PCB 7.

Figure 5:
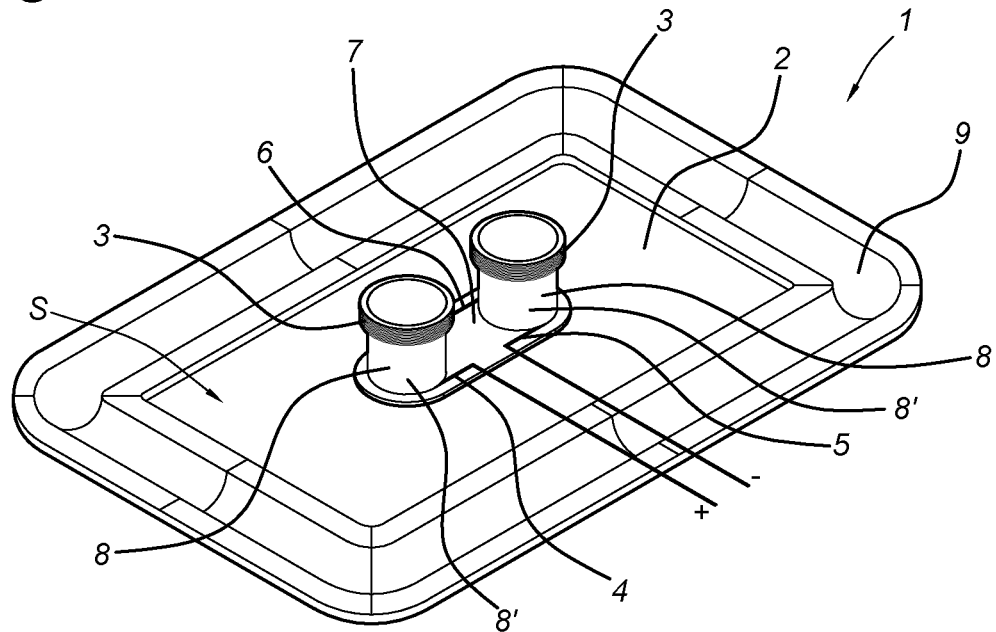
FIG. 5 shows a perspective view of a membrane unit according to a fifth embodiment of the present invention.

In FIG. 5 an embodiment is shown wherein the membrane unit 1 further comprises a suspension element 9 attached to the membrane 2, e.g. to a peripheral edge thereof, wherein the suspension element 9 is typically a flexible suspension element 9 to allow for movement of the membrane 2. The wiring 4, 5, 6 to the at least two coils (3) is provided at least partly on a flat part of the membrane 2, e.g. on the major surface S of the membrane 2. In the depicted embodiment, the membrane 2 may comprise a PCB 7 as a flat part of the membrane 2 on which the at least two coils 3 are arranged as well the wiring 4, 5, 6. That is, the wiring 4, 5, 6 may be embedded in or arranged on the PCB 7. From FIG. 5 it is clearly shown that the membrane 2 with the PCB 7 acts as a diaphragm and can have any desired shape according to specification. This provides a compact and simpler design and reduces component count.

As mentioned above, it is not strictly necessary to use a separate PCB 7 component arranged on the membrane 2 wherein the at least two coils 3 and the wiring 4, 5, 6 is arranged on the PCB. Instead, the membrane 2 and the PCB 7 may be formed in unitary fashion as a single piece component, and as such the PCB 7 is considered to be the membrane 2 so that the PCB 7 acts as a diaphragm for converting mechanical vibration to sound and vice versa.

Figure 6:
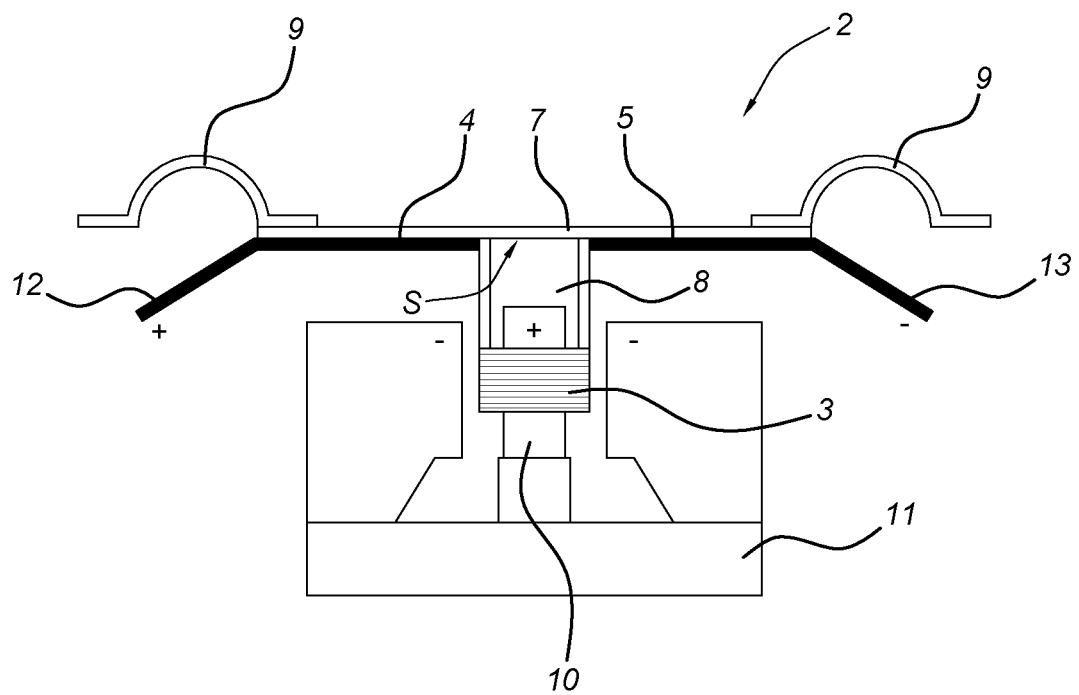
FIG. 6 shows a partial cross sectional view of a speaker device with a membrane unit according to a sixth embodiment of the present invention.

FIG. 6 shows an embodiment of a (electromagnetic) speaker device comprising the membrane unit 1 and a magnetic assembly 10, 11, wherein the at least two coils 3 are configured for magnetic engagement with the magnetic assembly 10, 11. In the embodiment each of the at least two (voice) coils 3 is paired with the magnetic assembly 10, 11 or any sort of driver assembly for the at least two coils 3. In an embodiment, the speaker device comprises input and output signal connections 12, 13 routed to the at least two coils 3 through/via the wiring 4, 5, 6 on or embedded in the membrane 2.

In FIG. 6 is it clearly shown that the membrane 2 has a substantially flat portion as wiring support element 7 which acts as a PCB 7 for routing the wiring 4, 5, 6 to the at least to coils 3. The aforementioned bobbin members 8 may be directly attached to the wire support element 7, i.e. the PCB 7. The bobbin members 8 may also be integrally formed with the wiring support element 7, i.e. the PCB 7.

According to the present invention there is no need to provide a separate planar or conal diaphragm part to the membrane 2 for producing sound. Indeed, in advantageous embodiments the membrane 2 is a PCB 7 for routing the wiring 4, 5, 6, wherein the PCB 7 is solely responsible for the conversion of mechanical vibration to sound or vice versa. Thus, the PCB 7 can be provided in any shape for forming the membrane/diaphragm 2 for a speaker device.

In FIG. 6 it is further shown that the at least two bobbin members 8 may be hollow bobbin members 8, e.g. cylindrical bobbin members 8, each of which is arranged to receive a magnetic pole (+) of the magnetic assembly 10, 11, so that the membrane 2, e.g. the PCB 7, is driven by the magnetic assembly 10, 11 through the at least two bobbin members 8.

The magnetic assembly 10, 11 may be connected to, or arranged in, a housing of a speaker device. The plurality of bobbin members 2, each of which has a coil 3, are arranged on the membrane 2, e.g. the PCB 7, which is driven by the magnetic assembly 10, 11 for producing sound.

Figure 7:
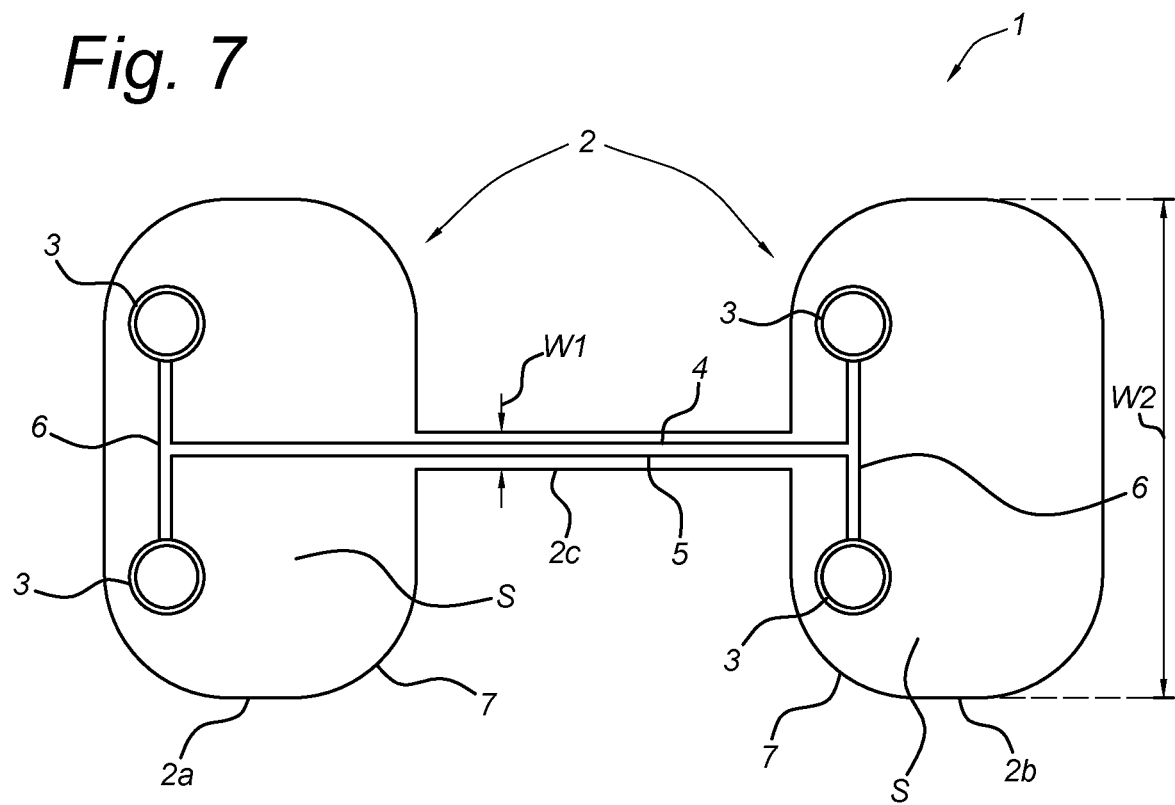
FIG. 7 shows a membrane comprising a bridge section according to an embodiment of the present invention.
Figure 8:
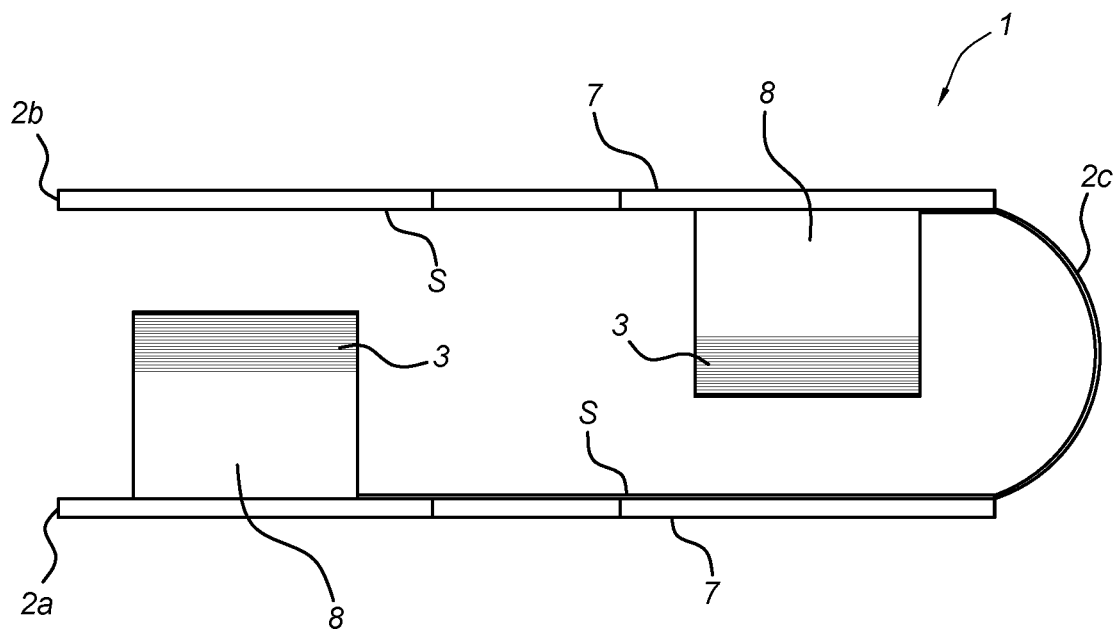
FIG. 8 shows a side view of a membrane in a folded configuration according to an embodiment of the present invention.

FIGS. 7 and 8 each shows top view and side view of a membrane unit 1, respectively, allowing for reduced manufacturing complexity and provide ease of assembly of a speaker device utilizing the membrane unit 1. In particular, FIG. 7 shows a top view of a membrane unit 1 wherein the membrane 2 comprises two spaced apart membrane sections 2a, 2b that are connected through a pliable (or flexible) bridge section 2c, wherein each of the membrane sections 2a, 2b comprises a coil of the at least two coils 3. In an embodiment as shown, each of the membrane section 2a, 2b may comprise two coils 3. The bridge section 2c has a width $W_1$ which is less than a width $W_2$ of each of the membrane sections 2a, 2b, wherein the two membrane sections 2a, 2c may be considered to be considerably wider that the bridge part 2c, allowing the bridge part 2c to easily bend or fold for bringing the major surfaces S of each membrane part 2a, 2b toward one another in opposing fashion as depicted in FIG. 8. As depicted, the coils 3 of each membrane section 2a, 2b extends toward the major surface S of the opposing membrane section.

In an embodiment the width $W_1$ of the bridge section 2c is at most 50% of the width $W_2$ of each of the membrane sections 2a, 2b, thereby increasing the foldability of the bridge section 2c. In exemplary embodiments the bridge section 2c has a width $W_1$ of at most 25%, 10%, or even at most 5% of the width $W_2$ of each of the membrane sections 2a, 2b to further increase the flexibility of the bridge section 2c. In even further embodiments, the bridge section 2c may comprise multiple (parallel) bridge section elements, the total width of the bridge section elements being equal to the width $W_1$.

Just like any other embodiment, the membrane 2 and in particular the membrane sections 2a, 2b, may be seen as diaphragms acting as transducers for converting mechanical vibrations of the membrane sections 2a, 2b to sound or vice versa. In an advantageous embodiment the membrane 2 may be a printed circuit board (PCB) which provides robust routing of the wiring 4, 5, 6 of each coil 3 of the membrane sections 2a, 2b. So in this embodiment the two membrane sections 2a, 2c and the bridge section 2c may be considered to form a single, foldable PCB.

As shown in FIG. 7, in an embodiment the wiring 4, 5 may be routed along the bridge section 2c for connecting each of the coils 3. The wiring 4, 5 may be arranged on the bridge section 2c or may be embedded therein, wherein the wiring 4, 5 may be seen as positive and negative terminals of the membrane unit 1.

In an advantageous embodiment, the membrane 2 may be a single PCB, wherein the two membrane sections 2a, 2b as well as the bridge section 2c, including the wiring 4, 5, 6, form a single piece component, so that the number of different components is reduced and as such the membrane unit 1 is simplified.

From a manufacturing point of view, the two membrane sections 2a, 2b and bridge section 2c may be obtained by die cutting a single piece of flat material to obtain the membrane 2 as shown in FIG. 7. For example, a single piece of flat material may be provided such as a single piece flat PCB comprising the wiring 4, 5, 6, to the at least two coils 3, and through a die cutting step the two spaced apart membrane sections 2a, 2b and bridge section 2c there between are formed. In subsequent steps of the manufacturing process the membrane 2 can be folded along the bridge section 2c as depicted in FIG. 8, i.e. to position the two membrane sections 2a, 2b parallel to one another with the at least two coils 3 being arranged between the two membrane sections 2a, 2b. A skilled person will appreciate that a die cutting step for obtaining the membrane 2 of FIG. 7 avoids having to manufacture the two membrane sections 2a, 2b separately and then to connect the membrane sections 2a, 2b by a separate bridge section 2c component.

An important advantage of the pliable/flexible bridge section 2c connecting the two membrane sections 2a, 2b, is that the membrane sections 2a, 2b as shown in FIG. 8 are able to vibrate freely and provide for a compact membrane unit 1. The bridge section 2c allows each coil 3 to be electrically connected efficiently whilst providing maximized freedom of motion to the membrane sections 2a, 2b.

In FIG. 8 it is further shown that the at least two coils 3 may be attached to a respective bobbin 8 each of which is attached to one of the membrane sections 2a, 2c. Specifically, in FIG. 8 each membrane section 2a, 2c may comprise two coils 3 that are attached to a respective bobbin 8, wherein the bobbins 8 are arranged between the two membrane sections 2a, 2b when the membrane 2 is folded. It should be noted that when the membrane 2 is folded along the bridge section 2c, then both of the at least two coils 3 may be positioned on a left side or right side of a membrane section 2a, 2b such that in a folded configuration of the membrane 2 the at least two coils 3 do not make contact or interfere. The same applies to the case when the at least two coils 3 are arranged on bobbins 8.

The present invention has been described above with reference to a number of exemplary embodiments as shown in the drawings. Modifications and alternative implementations of some parts or elements are possible, and are included in the scope of protection as defined in the appended claims.

The invention claimed is:

1. Membrane unit for a speaker device,
the membrane unit comprising a membrane and at least two coils,
wherein the respective longitudinal axes of the at least two coils are arranged in parallel, a main surface being formed perpendicular to the respective longitudinal axes,
the at least two coils being positioned adjacent to each other and mechanically connected to the membrane, the membrane being substantially flat and having a major surface parallel to the main surface,
wherein wiring to the at least two coils is provided at least partly on a flat part of the membrane, and
wherein the membrane comprises two spaced apart membrane sections connected through a bridge section, wherein the bridge section is more flexible than each of the membrane sections, and wherein each of the membrane sections comprises a coil of the at least two coils.

2. Membrane unit according to claim 1, wherein the flat part of the membrane is a wiring support element.

3. Membrane unit according to claim 2, wherein the wiring support element is a printed circuit board, the printed circuit board being part of the membrane.

4. Membrane unit according to claim 2, wherein the wiring support element is a printed circuit board, the printed circuit board being attached to the membrane.

5. Membrane unit according to claim 2, wherein the wiring support element is a printed circuit board, the printed circuit board forming the membrane.

6. Membrane unit according to claim 1, wherein the at least two coils are attached to a respective bobbin, the respective bobbins being attached to the membrane.

7. Membrane unit according to claim 6, wherein a part of the wiring to the at least two coils is provided on a surface of the respective bobbins.

8. Membrane unit according to claim 1, wherein the at least two coils are connected in parallel.

9. Membrane unit according to claim 8, wherein the wiring to the at least two coils comprise a parallel connection wiring provided on the membrane.

10. Membrane unit according to claim 1, wherein the at least two coils are connected in series.

11. Membrane unit according to claim 10, wherein the flat part of the membrane is a wiring support element, and the wiring to the at least two coils comprise a series connection wiring provided on the wiring support element.

12. Membrane unit according to claim 1, wherein the membrane unit further comprises a suspension element attached to the membrane, or to a peripheral edge thereof.

13. Method of manufacturing the membrane unit according to claim 1, comprising the steps of:
a) providing a single piece flat printed circuit board (PCB) comprising the wiring to the at least two coils; and
b) die cutting the single piece flat printed circuit board to form the two spaced apart membrane sections and the bridge section there between.

14. Method according to claim 13, further comprising the step of
c) folding the membrane along the bridge section to position the two membrane sections parallel to one another with the at least two coils being arranged between the two membrane sections.

15. Membrane unit for a speaker device,
the membrane unit comprising a membrane and at least two coils,
wherein the respective longitudinal axes of the at least two coils are arranged in parallel, a main surface being formed perpendicular to the respective longitudinal axes,
the at least two coils being positioned adjacent to each other and mechanically connected to the membrane, the membrane being substantially flat and having a major surface parallel to the main surface,
wherein wiring to the at least two coils is provided at least partly on a flat part of the membrane,
wherein the membrane comprises two spaced apart membrane sections connected through a bridge section, wherein each of the membrane sections comprises a coil of the at least two coils, and wherein a width ($W_1$) of the bridge section is at most 50% of a width ($W_2$) of each of the membrane sections.

* * * * *